(12) United States Patent
Hwang et al.

(10) Patent No.: US 7,566,757 B2
(45) Date of Patent: Jul. 28, 2009

(54) FLAME RETARDING EPOXY RESIN COMPOSITION CONTAINING NO HALOGEN

(75) Inventors: Kuen Yuan Hwang, Hsinchu (TW); An Pang Tu, Hsinchu (TW); Sheng Yen Wu, Hsinchu (TW); Yu Lin Huang, Hsinchu (TW)

(73) Assignee: Chang Chun Plastics Co., Ltd., Taipei (TW)

( * ) Notice: Subject to any disclaimer, the term of this patent is extended or adjusted under 35 U.S.C. 154(b) by 588 days.

(21) Appl. No.: 11/340,638

(22) Filed: Jan. 27, 2006

(65) Prior Publication Data

US 2007/0088136 A1    Apr. 19, 2007

(30) Foreign Application Priority Data

Oct. 13, 2005    (TW) .................................. 94135679

(51) Int. Cl.
*C08L 63/00*    (2006.01)
*B32B 27/38*    (2006.01)

(52) U.S. Cl. .................. 525/524; 523/400; 525/523
(58) Field of Classification Search .................. 428/413;
523/400, 451, 453; 528/86, 87
See application file for complete search history.

(56) References Cited

U.S. PATENT DOCUMENTS

| 3,367,990 | A | * | 2/1968 | Bremmer | 525/482 |
| 4,105,634 | A | * | 8/1978 | Hanson et al. | 526/65 |
| 4,593,078 | A | * | 6/1986 | Kooymans et al. | 525/497 |
| 2002/0192891 | A1 | * | 12/2002 | Takata et al. | 438/200 |
| 2005/0196619 | A1 | * | 9/2005 | Nakanishi et al. | 428/416 |

* cited by examiner

*Primary Examiner*—Michael J Feely
(74) *Attorney, Agent, or Firm*—Bacon & Thomas, PLLC

(57) ABSTRACT

The present invention relates to a flame-retarding epoxy resin composition containing no halogen, which comprises an epoxy resin containing no halogen, a toughening agent, and a flame retarding agent. The present flame-retarding epoxy resin composition exhibits a high heat-resistance and excellent adhesion and is useful as adhesive agent in flexible printed circuit board.

3 Claims, No Drawings

FLAME RETARDING EPOXY RESIN COMPOSITION CONTAINING NO HALOGEN

This Non-provisional application claims priority under 35 U.S.C. §119(a) on Patent Application No(s). 094135679 filed in Taiwan, Republic of China on Oct. 13, 2005, the entire contents of which are thereby incorporated by reference.

FIELD OF THE INVENTION

The present invention relates to a flame retarding epoxy resin composition containing no halogen, particularly to a flame retarding epoxy resin composition containing no halogen, which possesses excellent heat resistance and adhesion and is useful as an adhesive agent in flexible printed wiring board.

DESCRIPTION OF RELATED ART

With advancing the miniaturization and lighting of the electronic machines, a flexible printed wiring board is favorably used in many electronic designs to provide more spaces and flexibilities for mounting electronic parts.

For the flexible printed wiring board, by taking a board which uses copper foil as a substrate as an example, it is usually prepared by applying an adhesive agent on a plastic film, bonding the copper foil on the plastic film, and etching the cooper foil to form a desired circuit by using a mask having a desired pattern. Finally, to prevent the oxidization of the metal wires, it is usually further coated with a covering film to protect the resultant flexible printed wiring board.

Since the process for preparing a flexible printed wiring board requires a baking step at an elevated temperature, the plastic film and adhesive agent used should withstand the high temperature and possess dimensional stability. Among them, a polyimide film is most widely used as the plastic film.

To obtain high heat resistance and flam retarding property, most adhesive agents currently used in preparing a flexible printed wiring board are halogen-containing flame retarding agents or halogen-containing and/or antimony-containing epoxy resin compositions. However, the use of such a composition results in environmental pollution since such flame retarding agent or epoxy resin composition would release toxic gases such as dioxin when burning.

With increasing attention to the green environmental problem, the green environmental concept is taken into consideration during development for new material. Thus, the present inventors intend to provide a new epoxy composition which meets the requirements of green environmental concept, possesses excellent heat resistance, and can be used in preparing flexible printed wiring board.

The present inventors have conducted an investigation and thus completed the present invention.

SUMMARY OF THE INVENTION

The present invention relates to a flame retarding epoxy resin composition containing no halogen, particularly to a flame retarding epoxy resin composition containing no halogen, which possesses excellent heat resistance and adhesion and is useful as an adhesive agent in flexible printed wiring board.

The present invention provides a flame retarding epoxy resin composition containing no halogen, which comprises (a) an epoxy resin; (b) a toughening agent; and (c) a flame retarding agent;

wherein the epoxy resin (a) is selected from at least one of the following (a1) epoxy resin and (a2) epoxy resin:

(a1) an epoxy resin obtained by reacting a phenol compound represented by formula (I) with a compound having two epoxy functional groups and represented by formula (II):

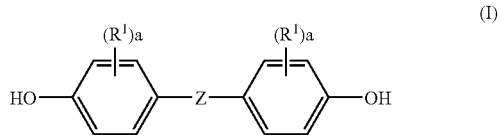

[wherein Z represents a direct bond, —O—, —S—, —SO$_2$—, —CO—, a C$_{1-6}$ alkylene group, or a group selected from the following groups:

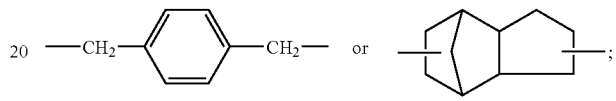

R$^1$s are the same or different and each represents a C$_{1-6}$ alkyl group or a hydroxyl group; a represents an integral of from 0 to 4];

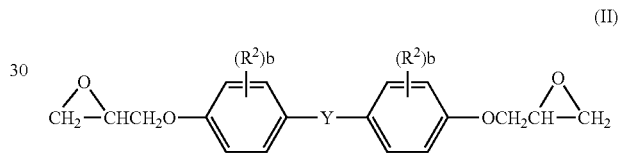

[wherein Y represents a direct bond, —O—, —S—, —SO$_2$—, —CO—, a C$_{1-6}$ alkylene group, or a group selected from the following groups:

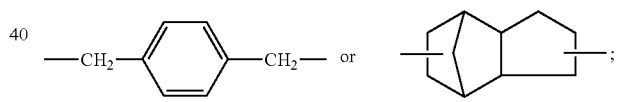

R$^2$s are the same or different and each represents a C$_{1-6}$ alkyl group or a hydroxyl group; b represents an integral of from 0 to 4];

wherein the ratio (H1/E1) of active hydrogen equivalent (H1) of the phenol compound represented by formula (I) to epoxy equivalent (E1) of the compound represented by formula (II) is in a range of from 0.6 to 1.2;

(a2) an epoxy resin obtained by reacting a phenol compound represented by formula (I) with a compound having two epoxy functional groups and represented by formula (II), and with a compound having at least four epoxy functional groups and represented by formula (III):

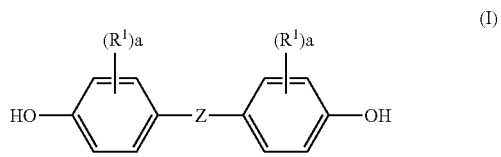

[wherein Z represents a direct bond, —O—, —S—, —SO$_2$—, —CO—, a C$_{1-6}$ alkylene group, or a group selected from the following groups:

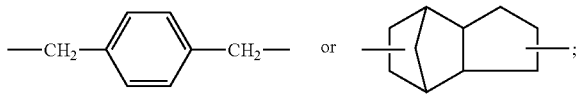

$R^1$s are the same or different and each represents a $C_{1-6}$ alkyl group or a hydroxyl group; a represents an integral of from 0 to 4];

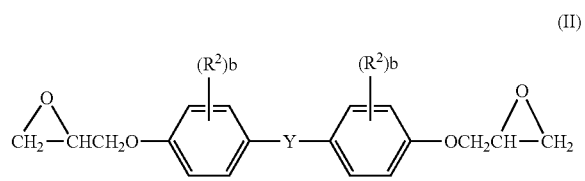

(II)

[wherein Y represents a direct bond, —O—, —S—, —SO$_2$—, —CO—, a $C_{1-6}$ alkylene group, or a group selected from the following groups:

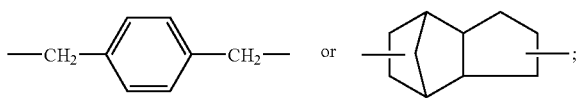

$R^2$s are the same or different and each represents a $C_{1-6}$ alkyl group or a hydroxyl group; b represents an integral of from 0 to 4];

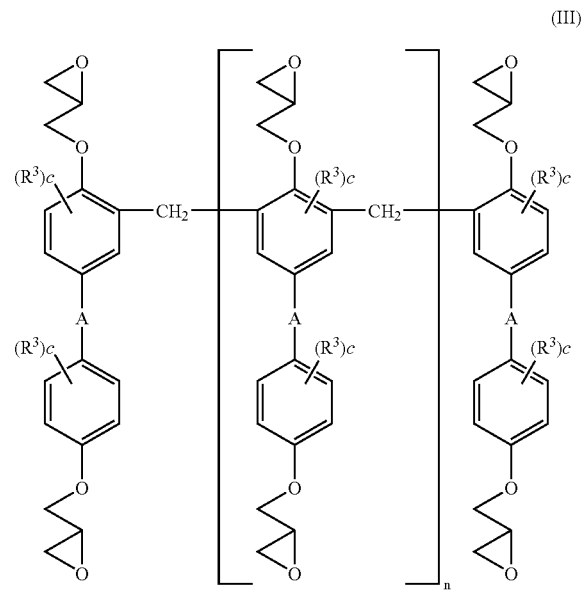

(III)

[wherein A represents a direct bond, —O—, —S—, —SO$_2$—, —CO—, a $C_{1-6}$ alkylene group, or a group selected from the following groups:

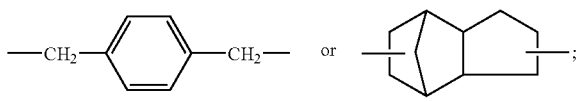

$R^3$s are the same or different and each represents a $C_{1-6}$ alkyl group or a hydroxyl group; c represents an integral of from 0 to 4; and n represents a number of from 0-20];

wherein the ratio [H1/(E1+E2)] of active hydrogen equivalent (H1) of the phenol compound represented by formula (I) to the total of epoxy equivalent (E1) of the compound represented by formula (II) and epoxy equivalent (E2) of the compound represented by formula (III) is in a range of from 0.4 to 2.0, preferably from 0.6 to 1.6; and the weight ratio of the compound represented by formula (II) to the compound represented by formula (III) is in a range of from 10/90 to 90/10, preferably from 15/85~85/15;

wherein the component (a) is present in an amount of 25~60% by weight, preferably from 30~55% by weight, the component (b) is present in an amount of 10~40% by weight, preferably from 15~30% by weight, and the component (c) is present in an amount of 3~35% by weight, preferably from 5~25% by weight, based on the total weight of the components (a), (b), and (c).

The flame retarding epoxy resin composition containing no halogen according to the present invention further comprises (d) a curing agent, (e) curing promoter, and (f) an inorganic filler, in which the curing agent (d) is present in term of active hydrogen equivalent of from 0.2 to 5.0, preferably from 0.6 to 3.0 parts relative to one equivalent of the epoxy group in the epoxy resin (a); the curing promoter (e) is present in an amount of 0.01 to 3.0% by weight, preferably from 0.1 to 1.5% by weight relative to the weight of the epoxy resin (a); and the inorganic filler (f) is present in an amount of 0.01 to 15.0% by weight, preferably 2.0 to 10.0% by weight relative to the total weight of the components (a), (b), and (c).

DETAILED DESCRIPTION OF THE INVENTION

The epoxy resin (a1) used in the present invention has an average weight molecular weight (Mw) in a range of from 700 to 20,000, preferably from 1,000 to 15,000, as measured by GPC (Gel Permeation Chromatography) converted into polystyrene molecular weight. The epoxy resin (a1) has an epoxy equivalent weight (EEW) in a range of from 700 to 1,500 g/eq, preferably from 900 to 1,200 g/eq, as measured by a standard of ASTM D1652.

The epoxy resin (a2) used in the present invention has an average weight molecular weight (Mw) in a range of from 3,000 to 28,000, preferably from 5,000 to 22,000, as measured by GPC (Gel Permeation Chromatography) converted into polystyrene molecular weight. The epoxy resin (a2) has an epoxy equivalent weight (EEW) in a range of from 700 to 1,500 g/eq, preferably from 900 to 1,200 g/eq, as measured by a standard of ASTM D1652.

The term "$C_{1-6}$ alkylene" for defining Z in formula (I), Y in formula (II), and A in formula (III) is intended to mean a straight or a branched alkylene, for example, methylene, ethylene, propylene, butylene, pentylene, hexylene, dimethylmethylene, methylmethylene, and their isomer.

In the flame retarding epoxy resin composition containing no halogen according to the present invention, examples of the phenol compound represented by formula (I) include, but are not limited to, bisphenol A, bisphenol F, bisphenol AD, bisphenol S, tetramethylbisphenol A, tetramethylbisphenol F, tetramethylbisphenol AD, tetramethylbisphenol S, 4,4'-biphenol, 3,3'-dimethyl-4,4'-biphenol, and 3,3',5,5'-tetramethyl-4,4'-biphenol, and the like.

In the flame retarding epoxy resin composition containing no halogen according to the present invention, examples of the epoxy resin represented by formula (II) include, but are not limited to, phenolic polyglycidyl ether, cresol-phenolic polyglycidyl ether, bisphenol A-phenolic polyglycidyl ether, and a mixture thereof, and the like.

In the flame retarding epoxy resin composition containing no halogen according to the present invention, the epoxy resin represented by formula (III) is derived from the phenol compound of formula (I) through polycondensation. Moreover, in the present invention, a nitrogen-containing epoxy resin can be used to instead of part of the epoxy resins (a1) and (a2).

Examples of the toughening agent (b) used in the present invention include, but are not limited to, acrylnitrile rubber, butadiene rubber, acrylnitrile-butadiene rubber, styrene-betadiene-styrene block copolymer, carboxy-terminated rubber, amino-terminated rubber, epoxy-terminated rubber, silicone rubber, polyacrylic rubber, and the like. The toughening agent can be used alone or in a combination thereof.

Examples of the flame retarding agent (c) used in the present invention include, but are not limited to, OP-930, OP935 (trade name, commercially available from Clariant Co., Ltd.), MPP (trade name, commercially available from JIAN XIN Corporation, Taiwan), SPE-100, SPB-100 (trade name, commercially available from Otsuka Chemicla Co., Ltd). In the present invention, the flame retarding agent (c) is the one containing no halogen.

In the present epoxy resin composition, the component (a) is present in an amount of 20~60% by weight, preferably from 25~55% by weight, the component (b) is present in an amount of 10~40% by weight, preferably from 15~30% by weight, and the component (c) is present in an amount of 3~35% by weight, preferably from 5~25% by weight, based on the total weight of the components (a), (b), and (c). By using each component in the above range, it can obtain a flame retarding epoxy resin composition exhibiting excellent heat resistance and adhesion and useful as an adhesive agent in flexible printed wiring board.

According to the present epoxy resin composition, it can further include (d) a curing agent, (e) a curing promoter; and (f) inorganic filler.

Examples of the curing agent (d) used in the present invention include, but are not limited to, dicyandiamide (DICY), bisphenol resins, polyhydroxy phenol resins, phenolic resins, anhydrides, and the like.

Examples of the bisphenol resin include a compound of the formula HO-Ph-X-Ph-OH (wherein Ph represents a phenylene group, X= a direct bond, —CH$_2$—C(CH$_3$)$_2$—, —O—, —S—, —CO— or —SO$_2$—). Embodiments of the bisphenol resin include, but are not limited to, tetramethylbisphenol AD, tetramethylbisphenol S, 4,4'-biphenol, 3,3'-dimethyl-4,4'-biphenol, 3,3,'5,5'-tetramethyl-4,4'-biphenol, and the like.

Examples of the polyhydroxy phenol resin include, but are not limited to, tris(4-hydroxyphenyl)methane, tris(4-hydroxyphenyl)-ethane, tris-(4-hydroxy-phenyl)-propane, tris(4-hydroxyphenyl)butane, tris(3-methyl-4-hydroxyl-phenyl)methane, tris(3,5-dimethyl-4-hydroxyphenyl)methane, tetrakis-(4-hydroxyphenyl)methane, tetrakis(3,5-dimethyl-4-hydroxy-phenyl) methane, and the like.

Examples of the phenolic resin include phenol-formaldehyde condensate, cresol-phenolic condensate, bisphenol A-phenolic condensate, dicyclopentadiene-phenolic condensate, and the like.

Examples of the anhydrides include, such as 3,3',4,4'-benzophenone-tetracarboxylic anhydride (BTDA), trimetallitic acid trianhydride (BTDA), pyromellitic acid dianhydride, and the like.

Examples of the curing promoter (e) used in the present invention include, but are not limited to, tertiary amines, tertiary phosphines, quaternary ammonium salts, phosphorium salts, boron trifluoride complexes, lithium compounds, imidazole compounds, or a combination thereof.

Examples of the tertiary amines include trimethylamine, triethylamine, diisopropyl ethylamine, dimethyl ethanolamine, dimethylaniline, tris(N,N-dimethylaminomethyl)phenol, N,N-dimethylaminemethyl-phenol, and the like.

Examples of the tertiary phosphine include triphenylphosphine, and the like.

Examples of the quaternary ammonium salts include tetramethylammonium chloride, tetramethylammonium bromide, triethylbenzylammonium chloride, triethylbenzylammonium bromide, triethylbenzylammonium iodide, and the like.

Examples of the phosphorium salts include tetrabutylphosphorium chloride, tetrabutylphosphorium bromide, tetrabutylphosphorium iodide, tetrabutylphosphate acetate complex, tetraphenylphosphorium chloride, tetraphenylphosphorium bromide, tetraphenylphosphorium iodide, ethyltriphenylphosphorium chloride, ethyltriphenylphosphorium bromide, ethyltriphenylphosphorium iodide, ethyltriphenylphosphate acetate complex, ethyltriphenylphosphate phosphate complex, propyltriphenylphosphorium chloride, propyltriphenylphosphorium bromide, propyltriphenylphosphorium iodide, butyltriphenylphosphorium chloride, butyltriphenylphosphorium bromide, butyltriphenylphosphorium iodide, and the like.

Examples of the imidazole include, for example, 2-methylimidazole, 2-phenylimidazole, or 2-ethyl-4-methylimidazole, and the like.

These curing promoters can be used alone or in a combination thereof.

Examples of the inorganic filler (f) used in the present invention include, but are not limited to, crystalline silica, molten silica, aluminum hydroxide, magnesium hydroxide, calcium carbonate, magnesium carbonate, calcium silicate, alumina, magnesium oxide, antimony oxide, zinc oxide, titanium dioxide, talc, diatomaceous earth, clay, mica, malemine pyrophosphate, malemine polyphosphate, MPP (trade name, commercially available from JIAN XIN Corporation, Taiwan), OP-930, and OP935 (trade name, commercially available from Clariant Co., Ltd.). These inorganic filler can be used alone or in a combination thereof.

The amount of the components (d) to (f) in the present epoxy resin composition can be varied in a wide range depending on the end use. However, it is desired that the curing agent (d) is present in term of active hydrogen equivalent of from 0.2 to 5.0, preferably from 0.6 to 3.0 parts relative to one the epoxy equivalent in the epoxy resin (a); the curing promoter (e) is present in an amount of 0.01 to 3% by weight, preferably from 0.1 to 1.5% by weight relative to the weight of the epoxy resin (a); and the inorganic filler (f) is present in an amount of 0.01 to 15% by weight, preferably 2.0 to 10% by weight relative to the total weight of the components (a), (b), and (c).

The present invention will be described in more detail by reference to the following Examples. But these examples are only used to illustrate the present invention without limiting the scope thereof.

In the following examples, the copper foil adhering test, soldering heat resistance test, flexibility test and flame retarding test of the flexible printed circuit board prepared in the Examples and Comparative Examples were measured as follows.

1. Copper Foil Adhering Test

This test was performed according to the method of IPC-TM-650 2.4.9. Firstly, a flexible printed circuit board was cut into specimens having a size of 2 cm×15 cm. Selected two specimens, each specimen was attached with two anti-etching tapes and subjected to etching, water washing, drying, and then laminated with prepreg to obtain a laminate. The laminate was peeled by using Peeling-off tester and the reading when the laminate peels off takes as the copper foil adhering strength and reported in kgf/cm.

2. Soldering Heat Resistance Test

This test was performed according to the method of IPC-TM-650 2.2.4. Firstly, a flexible printed circuit board was cut into specimens having a size of 3 inches×7 inches. Selected two specimens, each specimen was coated with solder on the copper surface and then baked at 135° C. for 1 hour and finally tested in a soldering pot at 288° C. to record the time that the polyimide film blistered or delaminating of the printed circuit board occurred. The recorded time is in term of seconds.

3. Flexibility Test

This test was performed according to the method of IPC-TM-650 2.6.18. First, a dry resist film was pressed on the copper surface of a flexible printed circuit board and a photographic film was placed on the dry resist film, and then it was subjected to exposing, developing, etching, and film stripping off. Reverse bend tester was used to test the flexibility of the above treated circuit board. The flexibility is in term of the bending number that the board was broken.

4. Flame Retarding Test

The flame retarding test was performed according to the vertical burning test of UL 94 (Underwriters Laboratory Subject 94) level V-0. Specifically, prepare five sample strips and the strip was placed so that its long axis is 180 degrees to the flame. The flame was applied to the sample strip for 10 seconds. If the flame was extinguished, the flame was ignited again maintaining for 10 seconds and then the flame was removed. After the first and the second ignitions, if the period of flaming and/or smoldering after removing the igniting flame does not exceed 10 seconds, it was determined as "pass". Alternatively, the period of flaming plus the period of smoldering in the second igniting does not exceed 30 seconds, it was determined as "pass". Alternatively, the total flaming time for five sample strips does not exceed 50 seconds, it was determined as "passed".

PREPARATION EXAMPLES

Preparation Example 1

Preparation of Epoxy Resin (a1):

88.4 grams of bisphenol A and 200.0 grams of bisphenol A diglycidyl ether were charged into 1.5 liters glass flask equipped with a heating mantle, a temperature controller, a magnetic stirrer, a nitrogen inlet, a thermal couple, a water-cooling condenser, and an addition funnel. The content in the flask was stirred to dissolve completely and the mixture was heated to a temperature of 120° C. and stirred for 1 hour. The resultant mixture was further added with 0.2 grams of 10% triphenyl phosphine and continuously heated at a temperature of 170° C. for 2 hours with stirring.

Removed the heating mantle and the temperature was lowered to 120° C., then the resultant product epoxy resin was discharged into an aluminum tray to stand and solidify upon returning to ambient temperature. It obtained 288.6 grams of the present product epoxy resin as a white and transparent solid. The obtained epoxy resin is referred as BE504, and its epoxy equivalent weight was measured as 950-1000 g/eq.

Preparation Example 2

Preparation of Epoxy Resin (a2):

102.2 grams of bisphenol A, 200.0 grams of bisphenol A diglycidyl ether, and 33.6 grams of the epoxy resin represented by the above formula (III)(in which $R^3$ represents a hydrogen and A represents a group of $—C(CH_3)_2—$, epoxy equivalent weight (EEW)=200 g/eq) were charged into 1.5 liters glass flask equipped with a heating mantle, a temperature controller, a magnetic stirrer, a nitrogen inlet, a thermal couple, a water-cooling condenser, and an addition funnel. The content in the flask was stirred to dissolve completely and the mixture was heated to a temperature of 120° C. and stirred for 1 hour. The resultant mixture was further added with 0.2 grams of 10% triphenyl phosphine and continuously heated at a temperature of 170° C. for 2 hours with stirring.

Removed the heating mantle and the temperature was lowered to 150° C., then the resultant product epoxy resin was discharged into an aluminum tray to stand and solidify upon returning to ambient temperature. It obtained 352.2 grams of the present product epoxy resin as a white and transparent solid. The obtained epoxy resin is referred as BE1000, and its epoxy equivalent weight was measured as 1002 g/eq.

EXAMPLES

Example 1

In a 300 ml beaker, 3.0 grams of aluminum hydroxide as an inorganic filler and 15.0 grams of the flam retardant OP930 were stirred in methyl ethyl ketone (MEK) as the solvent at room temperature for 30 minutes. Then the mixture was in sequence added with 40.0 grams of the epoxy resin BE1000 prepared in the above preparation example 2 (EEW=1002 g/eq) and 5.0 grams of the epoxy resin BE504 prepared in the above preparation example 1 (EEW=950-1000 g/eq) and stirred for 30 minutes. 15.0 Grams of phenolic resin PF6300 (nitrogen-containing phenolic resin, commercial available from Chang Chun Plastic Co., Ltd. Nitrogen content—16%) were added into the mixture and it was stirred for 20 minutes. Then 25.0 grams of acrynitrile-butadiene rubber as a toughening agent were further added and the mixture was stirred for 30 minutes. Finally, 0.8 grams of dicyandiamide (DICY) as a curing agent and 0.2 grams of 2-methylimidazole (2-MI) as a curing promoter were added and the mixture was stirred for 15 minutes to obtain epoxy resin composition having a solid content of 33% and a viscosity of 783 cps at 25° C.

The resultant epoxy resin composition was coated on Apical polyimide film (commercial available from Japan KANEKA HIHG-TECH. MATERIAL INC.) into a thickness of 25 μm by using a bar coater. The film was baked in an oven at 80° C. for 3 minutes and then at 140° C. for 3 minutes to remove solvent. After moving solvent, the thickness of the epoxy resin coating layer become 15 μm. Then the coated polyimide film was thermal laminated with JE RA ½ OZ copper foil at a temperature of 180° C. for 10 minutes by using a pressure of 100 kg/cm². Then the laminate was baked in an oven at 180° C. for 1 hour and then at 220° C. for 2 hours to cure. It obtained a flexible printed circuit board.

The resultant flexible printed circuit board was subjected to the copper foil adhering test, soldering heat resistance test, flexibility test, and flame retarding test mentioned above and the results were shown in Table 2.

Examples 2~8 and Comparative Examples 1~2

By using the components and amounts shown in the following Table 1, the epoxy resin compositions of Examples 2~8 and Comparative Examples 1~2 were prepared as similar to the process mentioned in the Example 1 and then similarly obtained flexible printed circuit boards of Examples 2~8 and Comparative Examples 1~2.

The resultant flexible printed circuit boards prepared in the Examples and Comparative Examples were subjected to the copper foil adhering test, soldering heat resistance test, flexibility test, and flame retarding test mentioned above and the results were shown in Table 2.

From the data shown in Table 2, it is clearly known that the flexible printed circuit board prepared by using the present epoxy resin compositions having no halogen (Examples 1~7) as the adhesive agent exhibit better peeling strength, heat resistance, and flexibility than those of Comparative Examples and their flame retardance achieves the specificity of V0 level regulated by UL-94.

According to the epoxy resin compositions having no halogen of the present invention, it is useful for as an adhesive agent in preparing flexible printed circuit board and achieves the peeling strength, heat resistance, flexibility, and flame retardance required in the printed circuit board field. The present epoxy resin compositions meet the requirement of green environmental protection since it does not contain halogen.

Additional advantages and modifications will readily occur to those skilled in the art. Therefore, the invention in its broader aspects is not limited to the specific details and representative embodiments shown and described herein. Accordingly, various modifications may be made without

TABLE 1

| | | Ex. 1 | Ex. 2 | Ex. 3 | Ex. 4 | Ex. 5 | Ex. 6 | Ex. 7 | Ex. 8 | Comp. Ex. 1 | Comp. Ex. 2 |
|---|---|---|---|---|---|---|---|---|---|---|---|
| Epoxy resin | BE1000 | 40.0 | 43.0 | 35.0 | 30.0 | 25.0 | 45.0 | — | 45.0 | — | — |
| | BEP318[1] | | | | | | | — | | 40.0 | |
| | BEP330[2] | | | | | | | | | | 40.0 |
| | BE504 | 5.0 | 5.0 | 5.0 | 15.0 | 20.0 | — | 45.0 | 15.0 | 5.0 | 5.0 |
| | PF-630[3] | 15.0 | 15.0 | 15.0 | 15.0 | 15.0 | 15.0 | 15.0 | — | 15.0 | 15.0 |
| Toughening agent | Acrynitrile-butadiene | 25.0 | 25.0 | 25.0 | 25.0 | 25.0 | 25.0 | 25.0 | 25.0 | 25.0 | 25.0 |
| Flam retarding agent | OP-930[4] | 15.0 | | | 15.0 | 15.0 | 15.0 | 15.0 | 15.0 | 15.0 | 15.0 |
| | MPP[5] | | 12.0 | | | | | | | | |
| | SPE-100[6] | | | 20.0 | | | | | | | |
| | Total | 100.0 | 100.0 | 100.0 | 100.0 | 100.0 | 100.0 | 100.0 | 100.0 | 100.0 | 100.0 |
| Solvent | MEK | 200.0 | 200.0 | 200.0 | 200.0 | 200.0 | 200.0 | 200.0 | 200.0 | 200.0 | 200.0 |
| Filler | Aluminum hydroxide | 3.0 | 3.0 | 3.0 | 3.0 | 3.0 | 3.0 | 3.0 | 3.0 | 3.0 | 3.0 |
| Curing agent | DICY | 0.8 | 0.8 | 0.6 | 0.6 | 0.6 | 0.8 | 0.8 | 0.8 | 0.8 | 0.8 |
| Curing promoter | 2-MI | 0.2 | 0.2 | 0.15 | 0.15 | 0.15 | 0.2 | 0.2 | 0.2 | 0.2 | 0.2 |
| Solid content(%) | | 33.0 | 33.0 | 33.0 | 33.0 | 33.0 | 33.0 | 33.0 | 33.0 | 33.0 | 33.0 |
| Viscosity 25° C.(cps) | | 783 | 638 | 823 | 967 | 1034 | 943 | 610 | 720 | 749 | 839 |

Note:
[1] BEP 318 is phosphorus-containing epoxy resin commercial available from Chang Chun Plastic Co., Ltd. Phosphorus content = 2.3-2.6%, EEW = 480 g/eq.
[2] BEP 330 is phosphorus-containing epoxy resin commercial available from Chang Chun Plastic Co., Ltd. Phosphorus content = 3.3%, EEW = 360 g/eq.
[3] PF-6300 is nitrogen-containing phenolic resin commercial available from Chang Chun Plastic Co., Ltd. Nitrogen content = 16%.
[4] OP-930 is an organic phosphate, a flame retarding agent, commercial available from Clariant Co., Ltd, German.
[5] MPP is melamine polyphosphate, a flame retarding agent, commercial available from JIAN XIN Corporation, Taiwan.
SPE-100 is a phosphorus- and nitrogen-containing flame retarding agent commercial available from Otsuka Chemicla Co., Ltd.

TABLE 2

| | Ex. 1 | Ex. 2 | Ex. 3 | Ex. 4 | Ex. 5 | Ex. 6 | Ex. 7 | Ex. 8 | Comp. Ex. 1 | Comp. Ex. 2 |
|---|---|---|---|---|---|---|---|---|---|---|
| Peeling strength (kgf/cm) | 1.78 | 1.65 | 1.34 | 1.6 | 1.43 | 1.42 | 1.53 | 1.50 | 1.24 | 1.03 |
| Heat resistance (sec) | 232 | 289 | 215 | 254 | 245 | 305 | 208 | 220 | 134 | 185 |
| Flexibility | 28827 | 27150 | 29823 | 31845 | 33254 | 26894 | 28743 | 26253 | 23425 | 21852 |
| Flame retardance UL-94 V0 | pass | pass | pass | pass | pass | pass | pass | pass | pass | pass |

What is claimed is:

1. A flame retarding epoxy resin composition containing no halogen, which comprises (a) an epoxy resin; (b) a toughening agent; and (c) a flame retarding agent;

wherein the epoxy resin (a) is a mixture of the following (a1) epoxy resin and (a2) epoxy resin, wherein (a1) and (a2) are provided in a weight ratio of from 20/25 to 5/40:

(a1) an epoxy resin obtained by reacting a phenol compound represented by formula (I) with a compound having two epoxy functional groups and represented by formula (II):

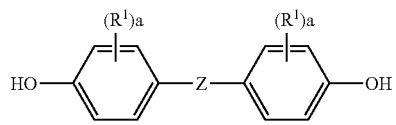
(I)

[wherein Z represents a direct bond, —O—, —S—, —$SO_2$—, —CO—, a $C_{1-6}$ alkylene group, or a group selected from the following groups:

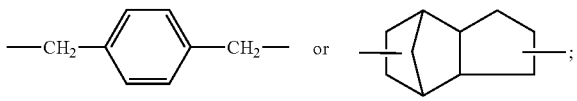

$R^1$s are the same or different and each represents a $C_{1-6}$ alkyl group or a hydroxyl group; a represents an integer of from 0 to 4];

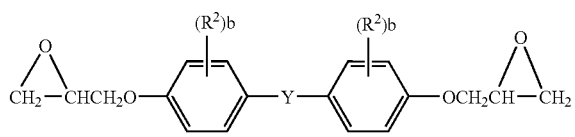
(II)

[wherein Y represents a direct bond, —O—, —S—, —$SO_2$—, —CO—, a $C_{1-6}$ alkylene group, or a group selected from the following groups:

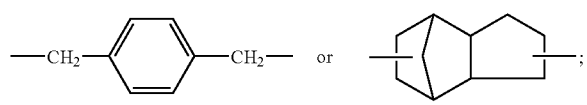

$R^2$s are the same or different and each represents a $C_{1-6}$ alkyl group or a hydroxyl group; b represents an integer of from 0 to 4];

wherein the ratio (H1/E1) of active hydrogen equivalent (H1) of the phenol compound represented by formula (I) to epoxy equivalent (E1) of the compound represented by formula (II) is in a range of from 0.6 to 1.2;

(a2) an epoxy resin obtained by reacting a phenol compound represented by formula (I), with a compound having two epoxy functional groups and represented by formula (II), and with a compound having at least four epoxy functional groups and represented by formula (III):

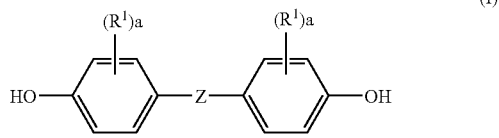
(I)

[wherein Z represents a direct bond, —O—, —S—, —$SO_2$—, —CO—, a $C_{1-6}$ alkylene group, or a group selected from the following groups:

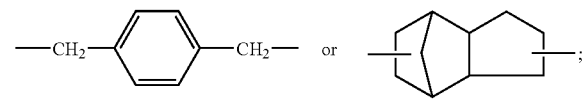

$R^1$s are the same or different and each represents a $C_{1-6}$ alkyl group or a hydroxyl group; a represents an integer of from 0 to 4];

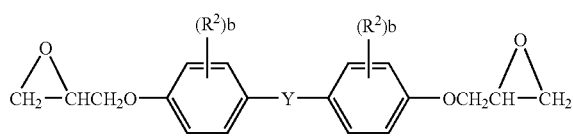
(II)

[wherein Y represents a direct bond, —O—, —S—, —$SO_2$—, —CO—, a $C_{1-6}$ alkylene group, or a group selected from the following groups:

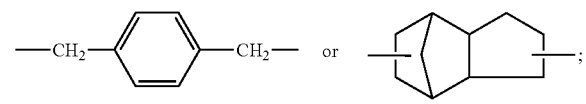

$R^2$s are the same or different and each represents a $C_{1-6}$ alkyl group or a hydroxyl group; b represents an integer of from 0 to 4];

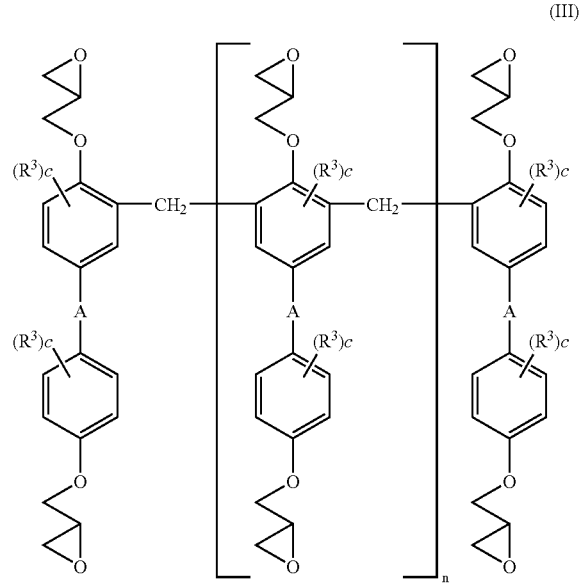
(III)

[wherein A represents a direct bond, —O—, —S—, —SO$_2$—, —CO—, a C$_{1-6}$ alkylene group, or a group selected from the following groups:

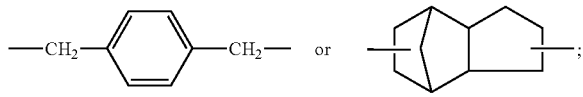

R$^3$s are the same or different and each represents a C$_{1-6}$ alkyl group or a hydroxyl group; c represents an integer of from 0 to 4; and n represents a number of from 0-20];
wherein the ratio [H1/(E1+E2)] of active hydrogen equivalent (H1) of the phenol compound represented by formula (I) to the total of epoxy equivalent (E1) of the compound represented by formula (II) and epoxy equivalent (E2) of the compound represented by formula (III) is in a range of from 0.4 to 2.0; and the weight ratio of the compound represented by formula (II) to the compound represented by formula (III) is in a range of from 10/90 to 90/10;
wherein the component (a) is present in an amount of 25~60% by weight, the component (b) is present in an amount of 0~40% by weight, and the component (c) is present in an amount of 3~35% by weight, based on the total weight of the components (a), (b), and (c).

2. The flame retarding epoxy resin composition containing no halogen according to claim 1, wherein the epoxy resin (a1) has an average weight molecular weight (Mw) in a range of from 700 to 20,000, as measured by GPC (Gel Permeation Chromatography) converted into polystyrene molecular weight and an epoxy equivalent weight (EEW) in a range of from 700 to 1,500 g/eq, as measured by a standard of ASTM D1652; and the epoxy resin (a2) has an average weight molecular weight (Mw) in a range of from 3,000 to 28,000, as measured by GPC (Gel Permeation Chromatography) converted into polystyrene molecular weight and an epoxy equivalent weight (EEW) in a range of from 700 to 1,500 g/eq, as measured by a standard of ASTM D1652.

3. The flame retarding epoxy resin composition containing no halogen according to claim 1, where further comprises (d) a curing agent, (e) curing promoter, and (f) an inorganic filler, in which the curing agent (d) is present in term of active hydrogen equivalent of from 0.2 to 5 parts relative to one equivalent of the epoxy group in the epoxy resin (a); the curing promoter (e) is present in an amount of 0.01 to 3.0% by weight relative to the weight of the epoxy resin (a); and the inorganic filler (f) is present in an amount of 0.01 to 15.0% by weight relative to the total weight of the components (a), (b), and (c).

* * * * *